United States Patent [19]

Adams

[11] 4,196,394

[45] Apr. 1, 1980

[54] ANTENNA/LIKE IMPEDANCE MATCHER

[75] Inventor: Guy E. Adams, Monroe, N.Y.

[73] Assignee: Solitron Devices, Inc., Tappan, N.Y.

[21] Appl. No.: 768,348

[22] Filed: Feb. 14, 1977

[51] Int. Cl.² .................... H04B 1/16; H01Q 1/34
[52] U.S. Cl. .................... 455/289; 455/107;
455/115; 343/861; 343/703
[58] Field of Search ............. 325/381, 383, 386, 387,
325/172, 173, 174, 175, 176, 177, 178, 133, 134,
111, 15.16, 117, 118, 119; 343/850, 852, 860,
862, 861, 703

[56] References Cited

U.S. PATENT DOCUMENTS

| 1,489,287 | 4/1924 | Taylor | 325/383 |
|---|---|---|---|
| 1,890,034 | 12/1932 | Gebhard | 343/850 |
| 1,998,322 | 4/1935 | Kaar | 343/860 |
| 3,009,057 | 11/1961 | Glaser | 325/133 |
| 3,056,925 | 10/1962 | Borck | 325/363 |
| 3,117,279 | 1/1964 | Ludvigson | 343/361 |
| 3,162,809 | 12/1964 | Yax | 325/381 |
| 3,540,057 | 11/1970 | Persson | 343/703 |
| 3,725,942 | 4/1973 | Ukmar | 343/860 |

OTHER PUBLICATIONS

E. F. Johnson Amateur Equipment, 1967, Industrial Electronics Catalog No. 67, p. 661.
SBE Touch/Com., Polular Electronics, Jun. 1976.
The Versatile Standing-Wave Radio Indicator, QST, Jun. 1958, pp. 15-18 & p. 156.
New from Quali Comp., Merchandising 2-Way Radio, p. 24.

Primary Examiner—Robert L. Griffin
Assistant Examiner—Tommy F. Chin
Attorney, Agent, or Firm—Richard G. Geib

[57] ABSTRACT

A matching coupler in an antenna system to power transfer in matching characteristic impedance of an antenna and a transmission line using a ganged variable capacitance with a resonate coil and another variable capacitance in series with a transmission line and an antenna.

3 Claims, 3 Drawing Figures

ANTENNA/LIKE IMPEDANCE MATCHER

SUMMARY

Heretofore mobile antennas for CB radio installation took many forms, from the full quarter-wave stainless steel whips to the shorter fiberglass loaded antennas. This was the first thing that one could see in either form and thereby know that a car, truck, boat, etc. had such a radio. In order to avoid thefts, crank calls and in order to save expenses attempts have been made to use existing antennas installed by automobile manufacturers, for example, as the CB radio antenna.

As one skilled in the art knows in regard to CB radio antennas mounting location of the antenna on the vehicle is an important consideration. Different locations were heretofore to effectuate desired ground plane effects for a desired radiation pattern. Heretofore one always compromised between practicalities of a short antenna on the roof and efficiency of antenna. In any such system it is necessary to remember that it comprises the antenna, transmission line and any coupling, loading or matching devices. It is in the latter that this invention is of utility, i.e. matching devices that will adjust the antenna system such that no RF energy is reflected toward the transmitter. Heretofore one such matching device used a tapering transmission line of slowly varying characteristic. Another has been in stub matching which is locating a line in parallel with a feeder and at a distance from the terminating impedance.

Any transmission line of a specific length is terminated with a characteristic impedance. If one could, he would like to obtain a means to equal the characteristic impedance of an infinitely long time. This can occur if the antenna and line are matched so that all the power fed into the input of the line will be radiated. In other cases a reflected wave is returned to the source, and a mismatch results in a part of the incident power being reflected back towards the source.

It is in the solution of a matching of transmission line to a less than desirable antenna element to obtain an antenna system capable of a desirable standing wave ratio (SWR) that this invention is primarily concerned.

A further object of this invention, especially in vehicle installations, is to reduce transmission line length and visibility whereby problems therewith can be significantly reduced.

DRAWING DESCRIPTION

DETAILED DESCRIPTION

Figure 1:
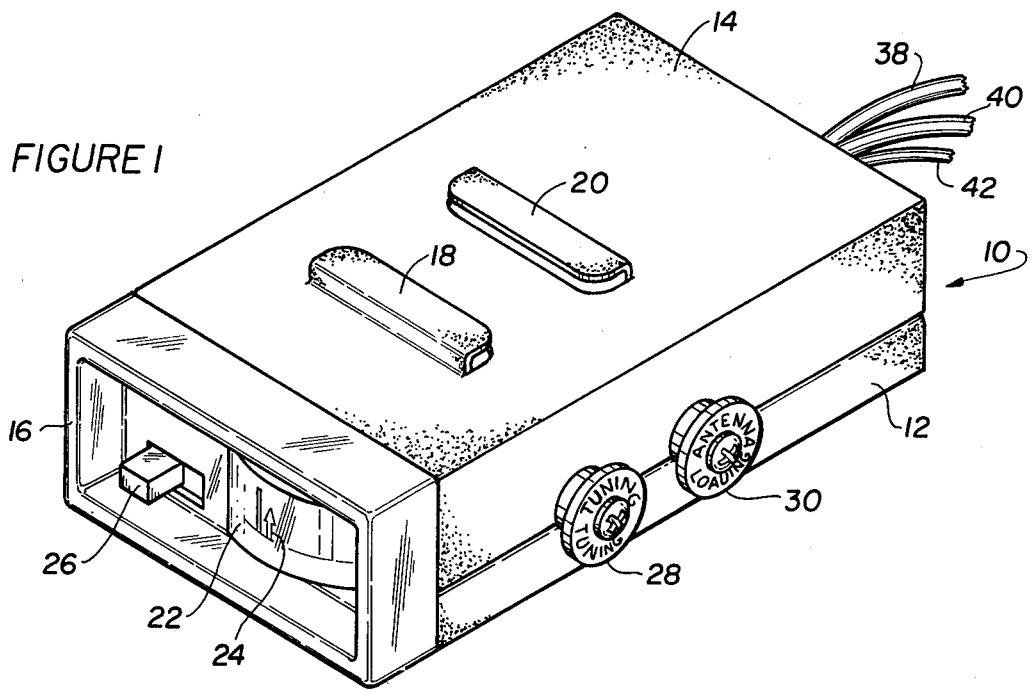
FIG. 1 is an isometric of an antenna matching device according to this invention.

With more particular reference to FIG. 1 there is shown an antenna matching device 10 having a base structure 12 for a cover 14 and face 16. Cover 14 is provided with facing flanges 18 and 20 formed from cut-outs in top of the cover and shaped to receive a plate (not shown) to be supported under a structure, i.e. the bottom of the instrument dash.

In the face there is mounted a meter 22 with an indicator 24. A switch arm 26 extends forwardly of the cover face 16 to permit energization of the matching device 10. Also knobs 28 and 30 to control tuning and antenna load project from the side of the device.

Figure 2:
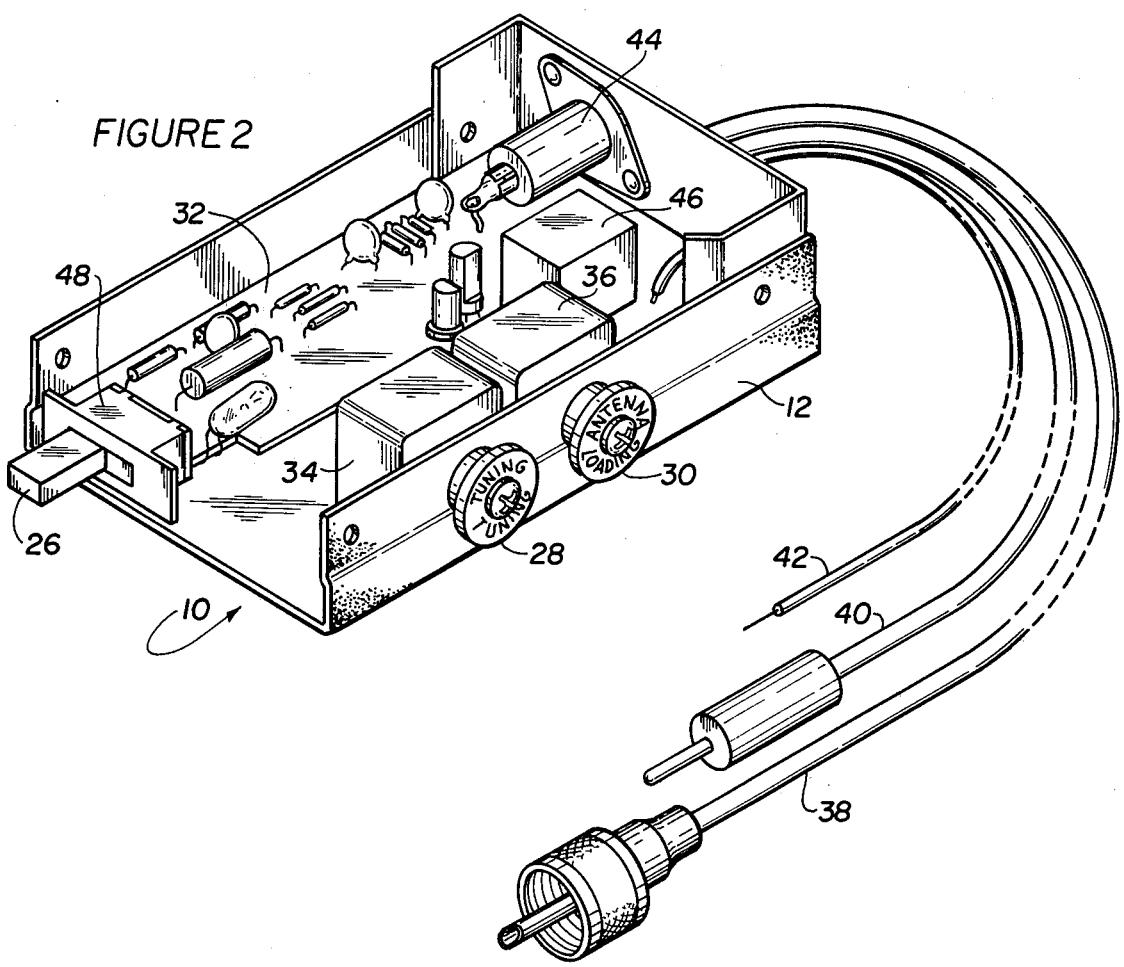
FIG. 2 is an isometric of the device of FIG. 1 with the cover and face plate removed to show the circuitry.

In FIG. 2 the base 10 is shown to mount a PC board 32, variable capacitors 34 and 36 and provide connections for coaxial transmission line 38, antenna output bridge 40 and an electrical lead 42. There is also adapted to the rear of the base an antenna input connector 44 to connect an antenna lead (not shown) as from a automobile antenna to the circuitry of the PC board 32. The device also includes relay means 46 to permit the device to switch between transmit and receiver modes of operation.

Figure 3:
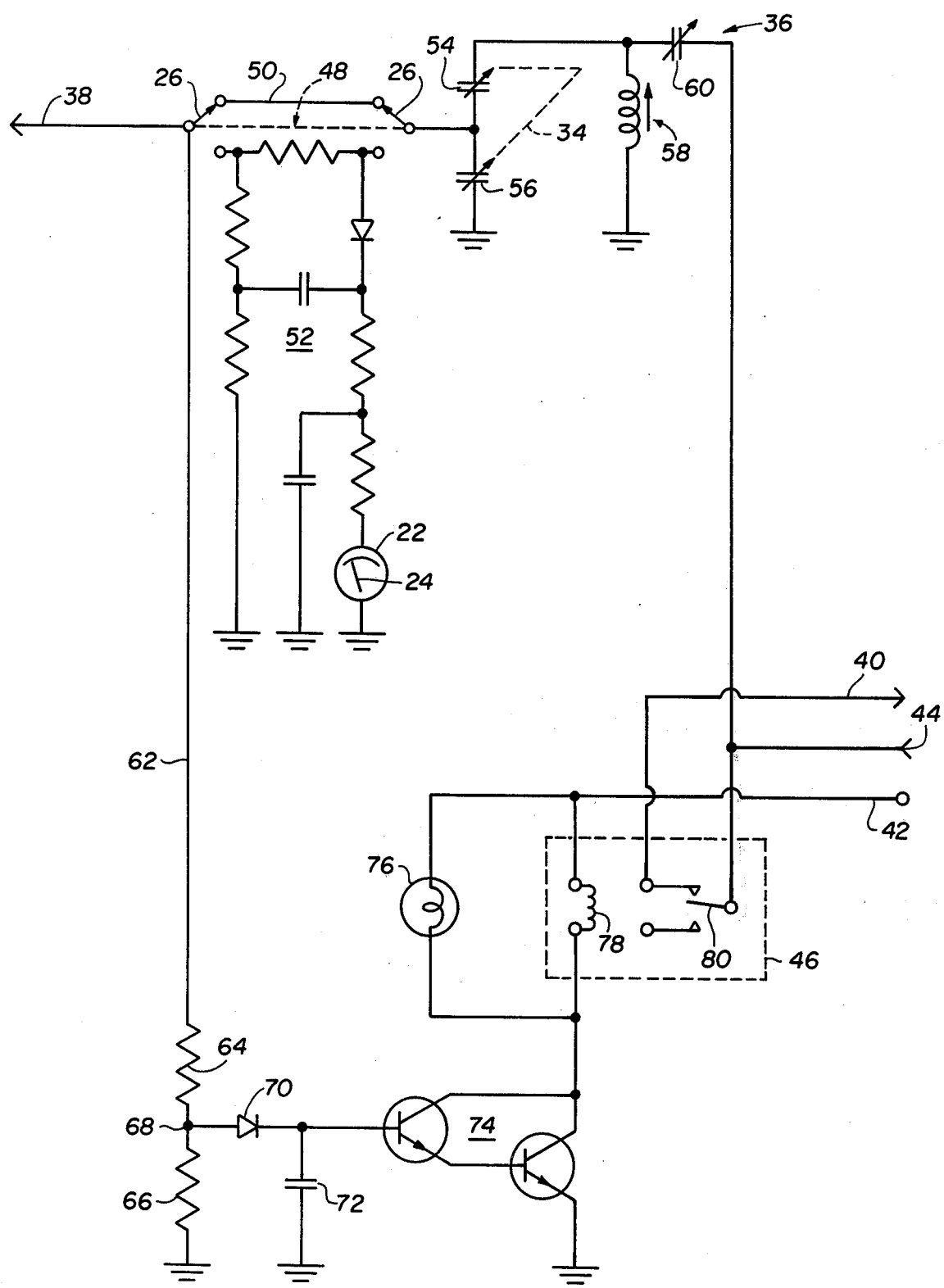
FIG. 3 is a schematic diagram of the circuitry of FIG. 2.

The circuitry of the PC board in one embodiment utilized to match a coat hanger, an automobile windshield or a random length antenna to a transmission line of a CB radio is shown by FIG. 3. There, the transmission line 38 is operatively connected via switch 48 to by-pass leg 50 or the measuring circuit 52 to measure reflected power. Between the switch and the antenna terminal 44 are ganged tuning capacitors 54 and 56, resonate coil 58 and antenna loading capacitance 60. At the juncture of the transmission line 38 with the switch 48 is lead 62 having a pair of resistors 64 and 66 to a ground potential. A tap 68 is taken between these resistors to a diode 70 whose output is smoothed by capacitor 72 in biasing darlington circuit 74 on in completing the circuit via lamp 76 from the positive source connection 42. This also activates coil 78 for operation of relay switch arm 80 to disconnect the remote antenna at input terminal 44 from the antenna output bridge 40 whereby the CB radio may transmit and receive via the transmission line input 38 thru the matching device 10 from the vehicle antenna connected as at 40.

Switch arm 26 is movable from by-pass 50 to connect measuring circuit 52 in the path between line 38 and antenna terminal 44. Indicator 24 of meter 22 is in the return path of such so as to measure reflected power from the antenna.

OPERATION

The coil 58 is tuned to the frequency on the line 38, as by rotating the tuning knob 28 until indicator 24 of meter 22 reaches its lowest position, noticeable by a tendency to increase thereafter. The load adjustment can be made by turning knob 30 to increase the capacity in the load to the antenna until indicator 24 again begins a reverse swing. Then knob 28 is rotated to dip indicator 24 still further until it shows signs of rising. This process of adjusting the reverse standing wave ratio is continued until one cannot dip indicator 24 with the antenna tuning knob 28. In one system a CB 50 ohm coax line was matched to a coat hanger acting as an antenna, a windshield antenna and a standard car mast antenna. This meant that maximum power of the CB transmitter was transferred and transmitted with the matching device 10 in the system.

In summation then, as one skilled in the art will understand, impedance is particularly important in connection with the transfer of RF power to the antenna. Impedance of an antenna is of particular importance in the transmission of radio signals in that the transmitter, the transmission line, and the antenna itself, all have certain value of impedance; and only when these impedances match will maximum RF energy be transferred between the transmitter and load or antenna. This invention provides means to equalize impedance along a given patch so that the ratio of voltage to current at any point along this path will be the same and standing waves representative of reflected energy is kept as low as possible, i.e. the SWR or ratio of maximum to minimum power is adjustable so that the load (antenna) at the point of connection to the transmission line is purely resistive and equal in value to the characteristic impedance of the transmission line and there will be no standing waves. This has particular utility in a CB radio/antenna network because there is little RF power to begin with and keeping SWR low enables one to get the maximum effective radiated power therefrom. No other device before this invention had the wide utility that it has of providing easy adjustment for all the varied CB transceivers and transmission lines let alone the advantage of being able to using anything as an antenna therefor at minimum loss in maximum effective radiated power for the system.

Having above described an operative arrangement of structure practically housed so that it can be reproduced by one skilled in the art it is now desired to set forth in conclusion the claims determinative of the scope of these Letters Patent.

I claim:

1. An antenna-line impedance matching device comprising:
    a coaxial transmission line;
    an antenna for said transmission line; and
    a means to match impedance of the line and the antenna, said means including,
        a switch circuit,
        a relay circuit means,
        a capacitance circuit between said switch circuit and said relay circuit means having a pair of ganged variable capacitors in a parallel circuit with a coil and another variable capacitor between the parallel circuit of ganged variable capacitors and coil and said relay circuit means, said ganged variable capacitors being controllable independantly of said another variable capacitor, and
        a circuit to measure reflected power connectable between said line and said capacitance circuit by said switch circuit.

2. An antenna-line matching device to be interposed with a coaxial transmission line and an antenna for the transmission line, said device comprising:
    a switch circuit connected to the line;
    a relay circuit means including an electronic circuit having a darlington controlled relay to control transmit/receive mode from the line to the antenna;
    a capacitance circuit between said switch circuit and said relay circuit means, said capacitance circuit having a pair of ganged variable capacitors in a parallel circuit with a coil and another variable capacitor in series with the parallel circuit in connecting the switch circuit to the antenna via the relay circuit means, said ganged variable capacitors being controllable independantly of said another variable capacitor;
    a circuit to measure reflected power connectable between said line and said capacitance circuit by said switch circuit;
    a housing for said device having a base plate, a cover and a face plate;
    a first knob rotatable outside on a side of said housing for simultaneously controlling said ganged variable capacitors;
    a second knob rotatable outside on a side of said housing for controlling said another variable capacitor; and
    an indicator meter means connectable by said switch circuit to said line and between said pair of ganged variable capacitors to provide indication of the nulling of the reflected power by operation of said first knob and said second knob in matching line and antenna load impedance.

3. The device of claim 2 wherein the meter means is an isolated part of the return leg of a resistive network so as to measure refected power in adjusting the first and second knobs for elemination of same.

* * * * *